(12) United States Patent  (10) Patent No.: US 8,035,419 B2
Penzes  (45) Date of Patent: Oct. 11, 2011

(54) HIGH-SPEED STANDARD CELLS DESIGNED USING A DEEP-SUBMICRON PHYSICAL EFFECT

(75) Inventor: Paul Penzes, Newport Beach, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 12/651,109

(22) Filed: Dec. 31, 2009

(65) Prior Publication Data

US 2011/0156749 A1    Jun. 30, 2011

(51) Int. Cl.
*H03K 19/00*    (2006.01)
(52) U.S. Cl. ............... 326/93; 326/21; 326/22; 326/26
(58) Field of Classification Search .................. None
See application file for complete search history.

(56) References Cited

U.S. PATENT DOCUMENTS

| 6,222,410 | B1 * | 4/2001 | Seno ........................ 327/293 |
| 6,380,764 | B1 * | 4/2002 | Katoh et al. .................. 326/93 |
| 6,842,045 | B2 * | 1/2005 | Shimazaki et al. ............ 326/95 |

* cited by examiner

*Primary Examiner* — Anh Tran
(74) *Attorney, Agent, or Firm* — Sterne, Kessler, Goldstein & Fox P.L.L.C.

(57) ABSTRACT

A system comprises signal paths. There are first through n signal paths, n being a positive integer. A critical one of the first through n signal paths is based on being a respective one of the first through n signal paths having a slowest signal propagation and/or a path in which a signal propagates slower than a clock cycle. The critical one of the first through n signal paths comprises a first size of a standard cell including corresponding logic devices. The non-critical ones of the first through n signal paths comprise a second size of a standard cell including corresponding logic devices, the second size being smaller than the first size.

17 Claims, 3 Drawing Sheets

HIGH-SPEED STANDARD CELLS DESIGNED USING A DEEP-SUBMICRON PHYSICAL EFFECT

FIELD OF THE INVENTION

The present invention generally relates to design and layout configurations for standard cells used in circuit and chip design.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 2:
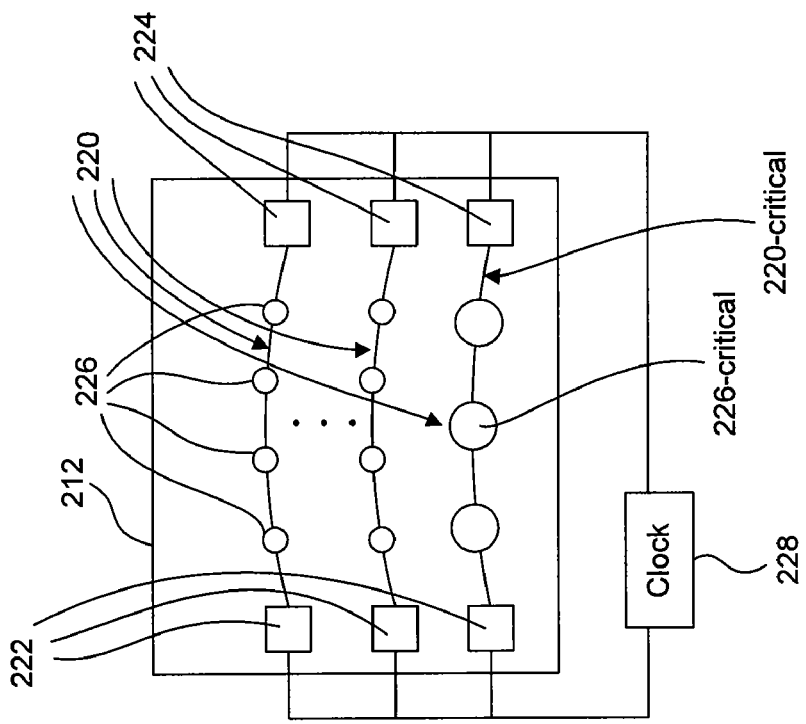
FIG. 2 shows a standard cell of an IC or a chip, according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

The present invention is directed to a hybrid standard cell library using larger standard cells in a critical path and smaller standard cells in non-critical paths. This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

An embodiment of the present invention provides a system comprising signal paths. There are first through n signal paths, n being a positive integer. A critical one of the first through n signal paths is based on being a respective one of the first through n signal paths having a slowest signal propagation and/or a path in which a signal propagates slower than a clock cycle. The critical one of the first through n signal paths includes logic devices that correspond to a first size of a standard cell. The non-critical ones of the first through n signal paths include logic devices that correspond to a second size of a standard cell, the second size being smaller than the first size.

Another embodiment of the present invention includes incorporating the system above as a standard cell of a chip or integrated circuit. The chip may also include one or more of pads, an analog portion, a digital portion, a memory, a conversion portion, and a serial-deserializer.

A further embodiment of the present invention provides a method used to produce a hybrid standard cell library. A critical signal path is determined in a plurality of signal paths, the critical path being one in which a signal propagates slowest and/or a path in which a signal propagates slower than a clock cycle. A first sized standard cell and corresponding logic devices are used along the critical signal path. A second sized standard cell and corresponding logic devices are used along remaining ones of the plurality of signal paths, the second size being smaller than the first size.

In additional or alternative embodiments, additional paths having a propagation speed below a threshold amount can be considered quasi-critical paths, and can include the larger sized standard cell.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

Figure 1:
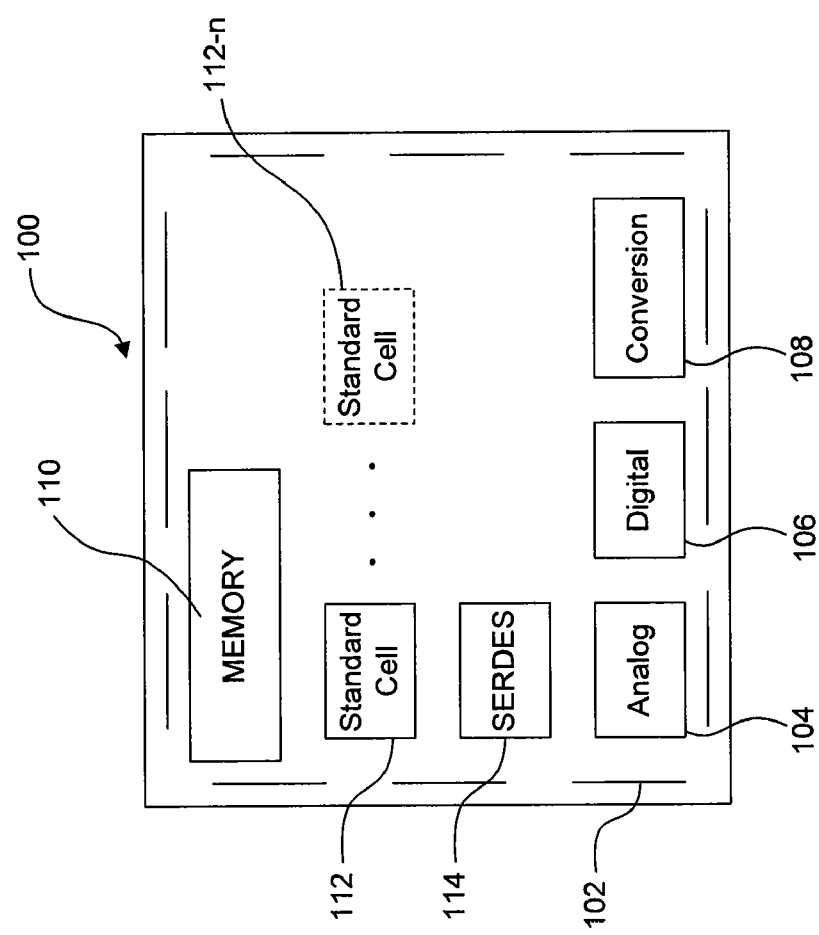
FIG. 1 shows an integrated circuit (IC) or chip, according to an embodiment of the present invention.

FIG. 1 shows an integrated circuit (IC) or chip 100. In one example, chip 100 can include one or more of pads 102, an analog portion 104, a digital portion 106, a conversion portion 108 (e.g., analog-to-digital and/or digital-to-analog conversions), a memory 110, and one or more standard cells 112-112*n*. Optionally, chip 100 can include a SERDES portion 114, which is a serial-deserializer device that converts input serial data to deserialized parallel data for use by the other portions of chip 100.

In one example, elements 102-114 can be proprietary or manufacturer specific, with the normal exception of standard cell(s) 112. Standard cell 112 can vary in size based on a size and/or number of devices thereon, e.g., a size of logic devices (sometimes referred to as gates, and used interchangeably below) thereon or a number of logic devices thereon, to provide an optimal combination of size, signal propagation speed, leakage, etc, or a combination thereof. For example, each standard cell 112 is designed to perform a specific function or set of functions or processes on a propagating signal. These functions are represented by combination of transistors forming various logic gates, as discussed in more detail below.

Typically, designing an integrated circuit or chip 100 includes several steps. Specifying the functionality of the chip in a standard hardware programming language (e.g., verilog). Synthesizing/mapping the circuit description into basic gates of a Standard Cell Library, e.g., using CAD tools like DesignCompiler® sold by Synopsys® of Mountain View, Calif. Placing and routing the gate netlist using CAD tools like BlastFusion sold by Magma™ of San Diego, Calif. Verifying proper connectivity and functionality of the circuit. It is to be appreciated alternative or additional steps may also occur. However, traditionally, the most important aspect of the design process, and most proprietary, is development of tools in a Standard Cell Library. As briefly discussed above, the Standard Cell Library comprises a set of standard cells, each standard cell having various arrangements of devices (e.g., logic devices comprising transistors) thereon to perform desired functions.

Currently, designers use several techniques to increase a speed of signal propagation in a chip.

Stress or strained engineering can be used to increase mobility of electron flow in transistors, such as stress engineering used by foundries. A detailed explanation of this technology is not provided herein for brevity, as stress or strain engineering is well known to a skilled artisan. For example, if the devices are transistors, deep submicron fabrication techniques can be used. Using deep submicron fabrication/doping techniques increases mobility or current flow between transistors of a logic device. For example, there can be about a 10-20% increase in mobility for N-transistors and about a 10-20% increase in mobility for P-transistors.

An alternate way to provide increased speed for standard cells is to duplicate and connect several transistors in parallel. While this method yields an increase in the drain saturation current proportional to the number of transistor duplications, it also increases the input capacitance proportionally. That increased input capacitance will have to be charged/discharged by the standard cell, which could actually result in a reduction in signal propagation speed.

Technology scaling allows for higher and higher levels of integration through shrinking of individual device sizes. According to Moore's Law, chips should double their signal propagation speed every 18 months. While this "law" has been applicable for more than 20 years, mere process scaling may no longer deliver the expected or required speed increases. This can be due to the fact certain device parameters have reached atomic scales. One of the consequences of this speed saturation due to technology scaling is that at each stage of the design process, discussed above, it has become more difficult to provide incremental increases in circuit performance. Even small speed improvements can require substantial design efforts. Therefore, as discussed above, having a robust and effective Standard Cell Library is critical to future increases in chip performance.

Thus, what is needed is a hybrid configuration of a standard cell, or a plurality of standard cells, of a chip that benefits from stress or strain engineering for a set of devices on standard cell without requiring a large increase in size and/or power consumption of an entire chip.

FIG. 2 shows a standard cell block 212, according to an embodiment of the present invention. Standard cell block 212 can include one or more paths 220.

In one example, each end of a path 220 includes a corresponding first (starting) register 222 and second (ending) register 224. In one example, each path 220 includes one or more devices 226, e.g., logic devices, between corresponding first and second registers 222 and 224. In one example, logic devices 226 can be transistor-based logic devices that implement desired functions, e.g., NAND/NOR gates, inverters, flip-flops, or the like. For example, logic devices 226 can be used to perform one or more processes (i.e., implement one or more functions) on a propagating signal along each path 220 as the signal propagates from being stored in first register 222 to being stored in second register 224.

In one example, each register 222 and 224 is coupled to a clock 228 that produces a clock signal setting a clock cycle. For example, at a first edge of a clock cycle a signal is transmitted from first register 222 along path 220 to be processed by one or more logic devices 226. At a second edge of the clock signal, the processed signal is received by second register 224. It is desired that all signals are completely processed within the duration of the clock signal so that they reach the second register 224 at the second edge of the clock signal.

It is to be appreciated that in one example each path 220 may have a different propagation time based on the type of functions that are performed, a number of transistors or other similar components, or other characteristics of each device 226, etc. In one example, one of the paths 220 has a slowest propagation time between first and second registers 222 and 224. The path 220 with the slowest propagation time is considered a critical path 220-critical. The critical path can be the path that needs the most increase in speed to ensure the propagating signal is received at second register 224 within the clock cycle.

It is also to be appreciated one or more other paths 220 may have propagation speeds below a threshold value, e.g., quasi-critical paths. In the quasi-critical paths, the threshold value may be the value needed to ensure the signals are received by second register 224 for that path 220 within the clock cycle duration.

In one example, the critical path, e.g., path 220-critical, includes logic devices 226-critical that have a first size and non-critical paths 220 have devices 226 that have a second size. In this example, the first size is bigger than the second size. For example, the first size can be based on using devices 226-critical that are "stretched" stress or strain engineered devices, while the second sized devices are traditional stress or strain devices, as discussed in more detail below. In one example, a stress or strain engineered device can be made larger or "stretched" to further increase mobility beyond that produced by stress or strain engineering. Stretching can be done by increasing the spacing between polysilicon strips of the device, which is discussed in more detail below. However, making each device larger across an entire standard cell can undesirably increase an overall size of each standard cell and the energy consumed by each standard cell, and thus the entire chip. For example, obtaining an approximate 10-20% increase in speed using a stretched device may result in approximately a 30-40% increase in size and approximately a 20-30% increase in leakage for chip. Also, due to the larger spacing of transistors, internal source/drain capacitance and internal wiring capacitance increases, which may actually degrade the speed gains. Thus, at the chip level only about an 8% increase in signal speed through the chip may result from the above size and leakage increases, which may be unacceptable for certain designs, especially given the increase in chip size.

Thus, in the example shown in FIG. 2, each standard cell block 212 has a hybrid combination of larger or stretched 226-critical devices and small devices 226. The hybrid combination is optimally chosen and arranged to increase signal propagation without requiring standard cell block 212 to become as large as would be required if only large sized devices 226-critical were used.

In summary, through using larger logic devices 226-ciritcal in critical path 220-critical, propagation time is decreased. Decreasing propagation time in critical path 220-critical increases an overall speed of standard cell block 212. Further, by choosing a sub-set of paths 220 to be critical paths 220-ciritcal (or quasi-critical paths), which limits the number of the larger sized logic devices 226-critical, and by using smaller logic devices 226 in all other non-critical paths 220, an overall standard cell block 212 size is reduced, while increasing overall chip speed. Also, by using fewer large sized devices 226-critical overall in standard cell block 212, power consumption, leakage, and other known parameters are optimized.

For example, by using the hybrid configuration described herein, the overall chip speed for a chip 100 can be increased by approximately 7-10% (e.g., from about 1283 MHz to about 1388 MHz), at the cost of an approximate 2-4% increase in total chip size. This size increase of 2-4% of chip 100 through using a hybrid combination of devices 226 is substantially less than the approximately 30% or more increase in size and/or power consumption that would be seen if only traditional stress engineered transistors were stretched for all paths 220 in all standard cells 212 on a chip 100 to obtain a similar result of an 8% increase in speed.

Figure 3:
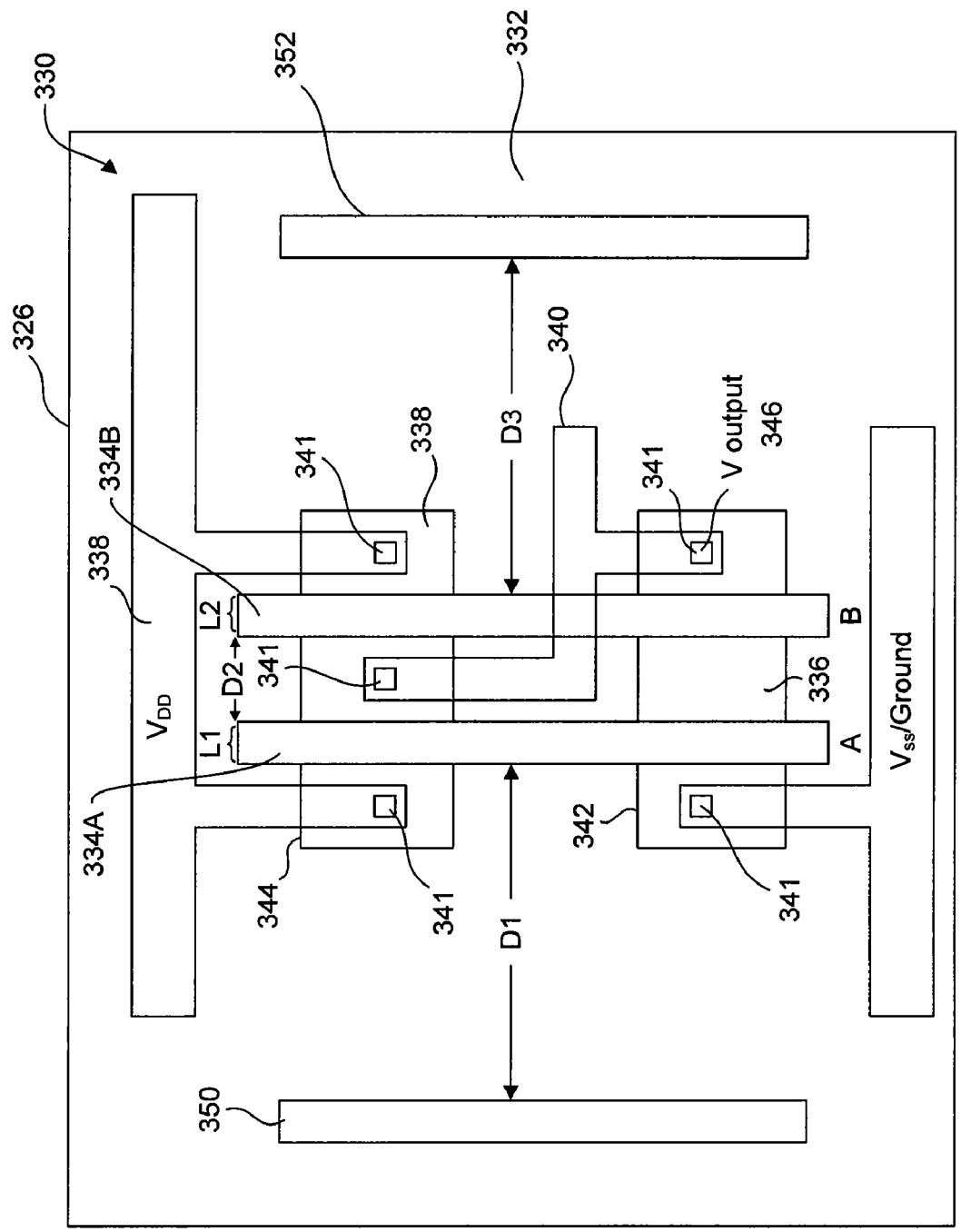
FIG. 3 shows a NAND gate in a standard cell of an IC or a chip, according to an embodiment of the present invention.

FIG. 3 shows a device 326, according to an embodiment of the present invention. For example, device 326 can be a NAND gate including CMOS transistors. In one example, the CMOS transistors can be manufactured using stress or strain engineering. As can be appreciated upon reading and understanding this description, many other types of devices or gates can be implemented using the embodiments described herein.

This example shows a NAND gate 326 drawn as a physical representation as it would be manufactured. NAND gate 326 is essentially parallel-connected first and second PMOS devices coupled to first and second series connected NMOS devices, as is known in the art. A circuit 330 is constructed on a P-type substrate 332. Polysilicon strips 334A, 334B, 350 and 352, diffusion areas 336 and 338, and an n-well (not shown) are referred to as "base layers," which can be inserted into trenches of P-type substrate 332. Contacts 341 penetrate an insulating layer (not shown) between the base layers and a first layer of metal 340 making a connection to the transistors.

In the example shown, inputs A and B to NAND gate 326 are via polysilicon strips 334A and 334B. The CMOS transistors (devices) are formed by the intersection of the polysilicon strips 334A and 334B and diffusion areas 336 and 338, e.g., N diffusion 336 for the N device 342 and P diffusion 338 for the P device 344. Output 346 is at a node based on coupling N and P type devices 342 and 344 via metal 340. Connections between metal and polysilicon or diffusion are made through contacts 341. N device 342 is manufactured on a P-type substrate 332. P device 344 is manufactured in an N-type well (n-well) on substrate 332. P-type device 344 is connected to Vdd and an N-type device 342 is connected to Vss (or ground) to prevent latchup.

In one example, "dummy" polysilicon strips 350 and 352, dummy since they do not serve an electrical function, are formed to emulate another transistor being proximate NAND gate 326. Adding polysilicon strips 350 and 352 can allow for secondary effects that increase transistor speed when there is another proximate transistor. Thus, by adding the additional "dummy" polysilicon strips 350 and 352 makes the functioning transistors think there is another transistor nearby to allow for optimal performance.

In one example, a distance D1 is maintained between polysilicon strips 350 and 334A, a distance D2 between polysilicon strips 334A and 334B, and distance D3 between polysilicon strips 334B and 352. Although not drawn to scale, D1, D2, and D3 may be substantially the same value. Also, in one example, predetermined gate lengths L, i.e., L1 and L2 for respective polysilicon strips 334A and 334B can be maintained to have a substantially similar desired length, L.

Referring back to FIG. 2, and with continuing reference to FIG. 3, for an example of a small logic device 226 in a non critical path 220, where L1=L2=L and D1=D2=D3=D, the parameters for device 326 could each be substantially L+D=0.04 µm+0.14 µm=0.18 µm in 40 nm devices. Also, an example of a large logic device 226-critical in a critical path 220-critical, where L1=L2=L and D1=D2=D3=D, the distance between polysilicon strips 350, 334A, 334B, and 352 for device 326 could be substantially L+D=0.04 µm+0.20 µm=0.24 µm. This increase in D1, D2, and D3, i.e., 0.14 µm to 0.20 µm can be based, for example, on stretching a stress or strain engineered device to increase a space between transistors, which further increases mobility of current flow beyond the increase resulting from using the stress or strain engineered device, as discussed above.

In one example, the quasi-critical devices could be equal in size to the critical devices 226-critical.

In one example, having both kinds of standard cells, hybrid and traditional, in the Standard Cell Library can be used to mitigate the increased area/leakage to continue meeting Moore's law. In this example, a fraction of the standard cell encompassed by critical paths is small. Thus, through using a mix of hybrid and traditional standard cells, or even using all hybrid standard cells, the overall area requirements becomes negligible with respect to the speed increase. For example, when critical paths comprise 10-15% of a total area of a standard cell, a net area increase from using the hybrid scheme can be about 0.9+0.1*1.25=1.025 or 2.5% increase. This small area increase of 2.5% is negligible compared to the 20-30% increase if all larger devices are used to achieve the 7-10% added speed.

Figure 4:
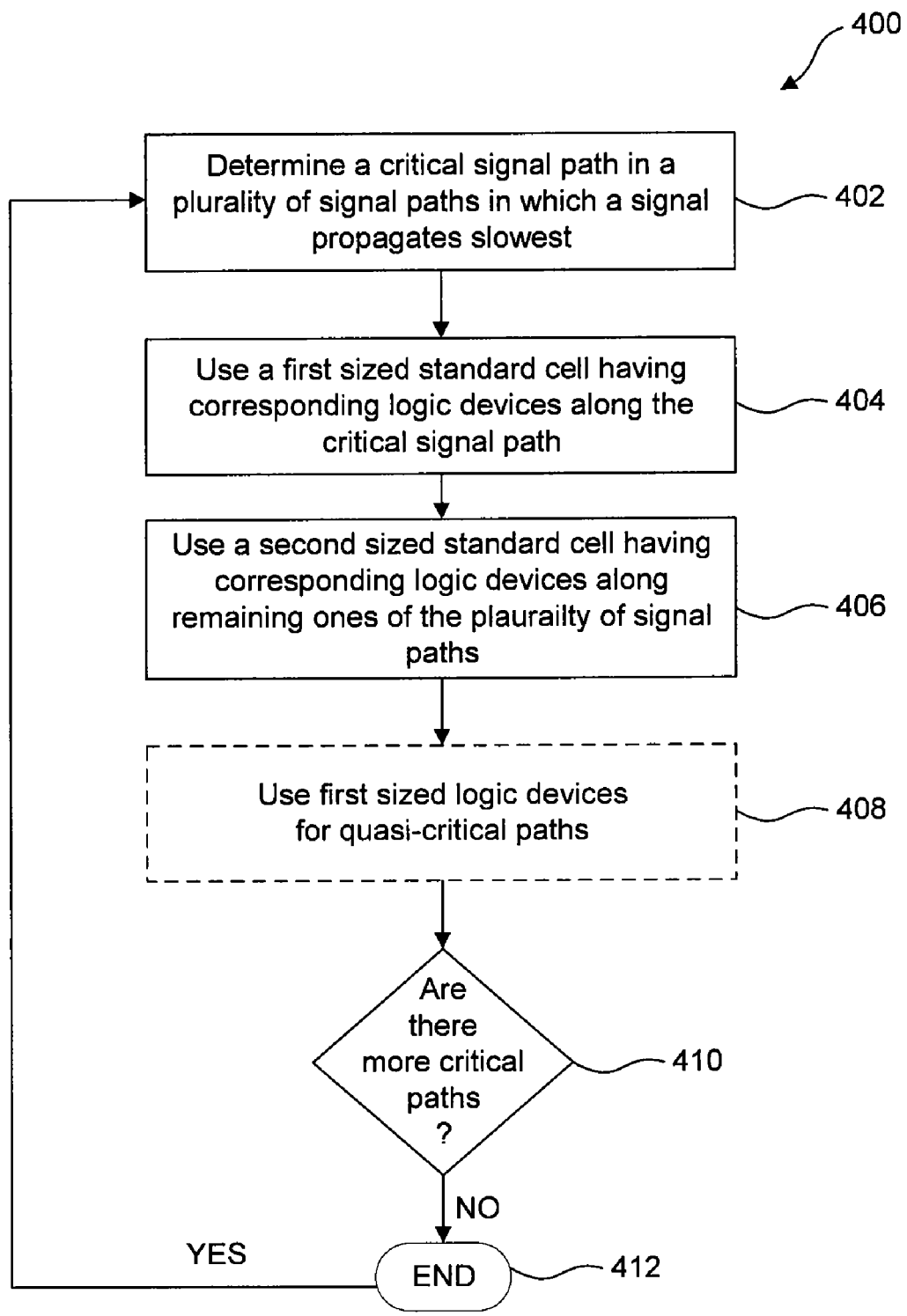
FIG. 4 shows a flowchart depicting a method, according to an embodiment of the present invention.

FIG. 4 shows a flowchart depicting a method 400, according to an embodiment of the present invention. For example, method 400 can be used to produce a hybrid standard cell library, as discussed above. In step 402, a critical signal path is determined in a plurality of signal paths, the critical signal path being one in which has the slowest signal propagation and/or a path in which a signal propagates slower than a clock cycle. In step 404, a first sized standard cell includes corresponding logic devices along the critical signal path. In step 406, a second sized standard cell includes corresponding logic devices along remaining ones of the plurality of signal paths, the second size being smaller than the first size. In additional or alternative processes, in optional step 408, additional paths having propagation speeds below a threshold amount can be considered quasi-critical paths, and can include the first sized logic devices.

Additionally, or alternatively, in an optional embodiment, either after step 406 or 408, at step 410 a determination is made whether additional critical paths exist. If yes, method 400 returns to step 402. If no, method 400 ends at step 412. The determination of step 410 can be based on whether a threshold speed or threshold speed increase has been achieved through changing the previously changed critical path. As each critical path is changed, another path may become critical until an overall speed threshold is achieved.

CONCLUSION

It is to be appreciated that the Detailed Description section, and not the Abstract section, is intended to be used to interpret the claims. The Abstract section may set forth one or more, but not all, exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A system comprising:
   first through n signal paths, n being a positive integer;
   a critical one of the first through n signal paths based on being a respective one of the first through n signal paths having a slowest signal propagation;
   wherein the critical one of the first through n signal paths include logic devices corresponding to a first size of a standard cell, the first size being increased to decrease the slowest signal propagation, and
   wherein non-critical ones of the first through n signal paths include logic devices corresponding to a second size of a standard cell, the second size being smaller than the first size.

2. The system of claim 1, further comprising:
   a first respective register at a first end of each of the first through n signal paths; and
   a second respective register at a second end of each of the first through n signal paths.

3. The system of claim 2, further comprising:
   a clock coupled to the first and second registers of each of the first through n signal paths, the clock configured to produce a clock signal setting clock cycle.

4. The system of claim 3, wherein the second register fails to receive the signal propagating through the critical one of the first through n signal paths before an end of the clock cycle if the first size of the logic devices is not used.

5. The system of claim 1, wherein the logic devices comprise transistor-based logic devices.

6. The system of claim 5, wherein:
   the first size is based on a first spacing between polysilicon strips of the transistors in the logic devices; and
   the second size is based on a second spacing between the polysilicon strips of the transistors in the logic devices.

7. The system of claim 1, wherein a spacing between logic devices of the first sized standard cell in the critical one of the paths is stretched.

8. The system of claim 1, further comprising:
   quasi-critical paths being one or more of the first through n signal paths having a signal propagation speed below a threshold value; and
   wherein each of the quasi-critical paths comprises the first size of the logic devices.

9. A system comprising:
   first through n signal paths, n being a positive integer;
   a critical one of the first through n signal paths based on being a respective one of the first through n signal paths having a signal propagation speed that is slower than a clock cycle;
   wherein the critical one of the first through n signal paths comprises a first size of a standard cell including corresponding logic devices, the first size being increased to increase the signal propagation speed that is slower than a clock cycle, and
   wherein non-critical ones of the first through n signal paths comprise a second size of a standard cell including corresponding logic devices, the second size being smaller than the first size.

10. An integrated circuit, comprising:
    pads;
    at least one of,
        an analog signal portion;
        a digital signal portion;
        a signal conversion portion;
    a memory; and
    a standard cell, the standard cell comprising,
        first through n signal paths, n being a positive integer,
        a critical one of the first through n signal paths based on being a respective one of the first through n signal paths having a slowest signal propagation,
        wherein the critical one of the first through n signal paths comprises a first size of logic devices, the first size being increased to decrease the slowest signal propagation, and
        wherein non-critical ones of the first through n signal paths comprise a second size of logic devices, the second size being smaller than the first size.

11. The chip of claim 10, further comprising one or more additional standard cells.

12. A method comprising:
    determining a critical signal path in a plurality of signal paths in which a signal propagates slowest;
    using a first sized standard cell having corresponding logic devices along the critical signal path, the first sized standard cell being increased to decrease the signal that propagates slowest; and
    using a second sized standard cell having corresponding logic devices along remaining ones of the plurality of signal paths, the second size being smaller than the first size.

13. The method of claim 12, further comprising using transistor-based logic devices for the logic devices.

14. The method of claim 13, wherein spacing between polysilicon strips of the transistors is larger in the first sized logic devices than the second sized logic devices.

15. The method of claim 13, further comprising using stretched spacing between logic devices.

16. The method of claim 12, further comprising:
determining quasi-critical ones of the signal paths having a propagation speed below a threshold value; and
using the first size of the logic devices in the quasi-critical ones of the signal paths.

17. A method comprising:
determining a critical signal path in a plurality of signal paths in which a signal propagates slower than a clock cycle;
using a first sized standard cell including corresponding logic devices along the critical signal path, the first sized standard cell being increased to decrease the signal that propagates slower than a clock cycle; and
using a second sized standard cell including corresponding logic devices along remaining ones of the plurality of signal paths, the second size being smaller than the first size.

* * * * *